(12) United States Patent
Lahiri et al.

(10) Patent No.: US 8,653,898 B2
(45) Date of Patent: Feb. 18, 2014

(54) CRYSTAL OSCILLATOR CIRCUIT

(75) Inventors: Abhirup Lahiri, New Delhi (IN); Anurag Tiwari, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/173,420

(22) Filed: Jun. 30, 2011

(65) Prior Publication Data
US 2012/0161888 A1 Jun. 28, 2012

(30) Foreign Application Priority Data
Dec. 28, 2010 (IN) .......................... 3122/DEL/2010

(51) Int. Cl.
*H03B 5/36* (2006.01)
(52) U.S. Cl.
USPC .................. 331/116 FE; 331/158; 331/160; 331/185
(58) Field of Classification Search
USPC ........... 331/116 FE, 116 M, 116 R, 154, 158, 331/160, 185
See application file for complete search history.

(56) References Cited

U.S. PATENT DOCUMENTS

| | | | | | |
|---|---|---|---|---|---|
| 3,855,549 | A | * | 12/1974 | Huener et al. | 331/108 D |
| 4,591,808 | A | * | 5/1986 | Lucas et al. | 331/116 FE |
| 5,909,152 | A | * | 6/1999 | Li et al. | 331/116 FE |
| 6,172,575 | B1 | * | 1/2001 | Shinmori | 331/116 FE |
| 6,278,338 | B1 | * | 8/2001 | Jansson | 331/116 FE |
| 7,002,422 | B1 | * | 2/2006 | Liu | 331/158 |
| 7,616,074 | B2 | * | 11/2009 | Toffolon et al. | 331/185 |
| 7,948,329 | B2 | * | 5/2011 | Lim | 331/160 |
| 8,188,802 | B2 | * | 5/2012 | Garcia | 331/185 |
| 2012/0092079 | A1 | * | 4/2012 | Huang | 331/109 |

* cited by examiner

*Primary Examiner* — Levi Gannon
(74) *Attorney, Agent, or Firm* — Graybeal Jackson LLP

(57) ABSTRACT

An embodiment of a crystal oscillator circuit includes leakage-current compensation, transconductance enhancement, or both leakage-current compensation and transconductance enhancement. Such an oscillator circuit may draw a reduced operating current relative to a conventional oscillator circuit, and thus may be suitable for battery or other low-power applications.

37 Claims, 4 Drawing Sheets

CRYSTAL OSCILLATOR CIRCUIT

PRIORITY CLAIM

The instant application claims priority to Indian Patent Application No. 3122/DEL/2010, filed Dec. 28, 2010, which application is incorporated herein by reference in its entirety.

TECHNICAL FIELD

An embodiment relates broadly to a crystal oscillator circuit, to a method of operating a crystal oscillator core, a digital integrated circuit, and a communication device.

BACKGROUND

Crystal oscillators are one of the most important and widely used circuits for precise clock-generation in integrated circuits. Single-transistor-based Pierce and Collpitt oscillators are typically used in the industry for the oscillator core. There is a need to design ultra-low-power crystal oscillators, e.g., for applications in battery-powered biomedical devices and real-time-clock (RTC) chip sets. Such devices typically should be capable of being used for a relatively long period of time without a need of changing the battery. Therefore, such applications favor the design of crystal oscillator circuits which consume less power and help increase the battery life.

With shrinking CMOS technologies, leakage currents are becoming increasingly more important for robust analog designs in CMOS technologies. In the case of crystal oscillators, leakage current at the crystal input nodes, which may arise due to the Electrostatic Discharge (ESD) protection devices at these nodes, may directly alter the drain current of the transistor and, therefore, the operating transconductance and the achieved negative resistance may be affected. Therefore, even if low-power crystal oscillators are made such that the leakage current at the crystal input nodes is comparable in magnitude and opposite in direction to the bias current, the circuit still might fail to produce oscillations due to insufficient negative resistance. This is because the operating transconductance typically cannot be greater than the critical transconductance that is due to the reduced device current. Thus, a circuit designer typically takes into account both transconductance enhancement, so that the operating transconductance (typically at least three times greater than critical transconductance) is achieved with reduced bias current, and leakage-current (at the crystal nodes) compensation for robust circuit operation.

The design of conventional single-transistor three-point oscillator core 100, see FIG. 1, involves generation of negative resistance sufficient to overcome the crystal losses, i.e., the series resistance of the crystal. This typically involves setting the operating transconductance $gm_{op}$ to be sufficiently greater than the critical transconductance (typically, as a rule of thumb, at least three times the value of the critical transconductance, i.e., $gm_{op} \geq 3 gm_{crit}$). This typically ensures a good start-up margin and is a robustness feature to make the design work across process "corners," i.e., process variations that may affect the operating transconductance. The critical transconductance is the minimum transconductance required for the oscillator to start and its value is given by the following equation:

$$gm_{crit} = \omega^2 C_1 C_2 R_m \left( 1 + \frac{C_0(C_1 + C_2)}{C_1 C_2} \right)^2 \quad (1)$$

where, $\omega$ is the angular frequency at which it is desired that the oscillator operate, $R_m$ is the motional resistance of the crystal (not shown in FIG. 1), Co is the shunt capacitance (not shown in FIG. 1) of the crystal, and C1 and C2 (neither shown in FIG. 1) are the load capacitances coupled between the node XTALIN and ground and the node XTALOUT and ground, respectively. For example, a typical 32 kHz crystal has $Rm \approx 50$ k$\Omega$, $Co \approx 4$ pF (this value already includes the approximately 2 pF parasitic capacitance between the crystal nodes), and $C_1 \approx C_2 \approx 30$ pF such that the transconductance values are $gm_{crit} \approx 3$ µA/V and $gm_{op}$ is approximately equal to or greater than 9 µA/V to achieve a magnitude of negative resistance of more than 150 k$\Omega$.

An inverter-type oscillator core 200, see FIG. 2, has been proposed which uses two stacked transconductance devices (one NMOS and one PMOS device). Under the condition that the transconductance of the NMOS and PMOS device are approximately the same (i.e., $gm_P \approx gm_N$), for a given bias current $I_B$ the proposed inverter-type oscillator core provides approximately twice the transconductance as compared to a conventional Pierce Oscillator core such as shown in FIG. 1. This means that to achieve the same operating transconductance, the proposed inverter-type oscillator requires about half the bias current $I_B$ as that of a Pierce oscillator. However, the aforementioned improvement in the current consumption typically requires a node X between $V_{DD}$ and the stacked transistors of the inverter-type oscillator to be virtually grounded (e.g., AC grounded). For example, such a virtual ground may be achieved by using an extra capacitor $C_c$ such that the pole frequency $f_p$ is given by the following equation:

$$f_p = \frac{gm_P}{2\pi C_c} \ll f_{op} = 32 \text{ kHz} \quad (2)$$

Assuming that $gm_P \approx gm_N \approx 0.5 \cdot gm_{op} \approx 1.5 \cdot gm_{crit} \approx 4.5$ µA/V, and considering that $f_p \approx f_{op}/100$ (i.e., the magnitude of a small signal voltage at the gate of the PMOS device is attenuated by a factor of 100), the design calls for $C_c \approx 2.2$ nF. As will be appreciated, such a capacitor is generally too big to be integrated on a die on which the other components of the oscillator, and the components of other circuits, are integrated. Thus, the use of such an inverter-type oscillator for a 32 kHz crystal oscillator may require a prohibitively large virtual-grounding capacitance value for applications in which it is desired to integrate the virtual-grounding capacitor on the same die as the other oscillator components.

SUMMARY

An embodiment includes an oscillator having a circuit architecture that may provide a higher transconductance value than a conventional oscillator for a given current while avoiding the use of a capacitor for virtual grounding a non-supply node of the oscillator.

BRIEF DESCRIPTION OF THE DRAWINGS

One or more embodiments will be better understood from the following written description, which is given by way of example only, and in conjunction with the following drawings, in which.

DETAILED DESCRIPTION

Figure 1:
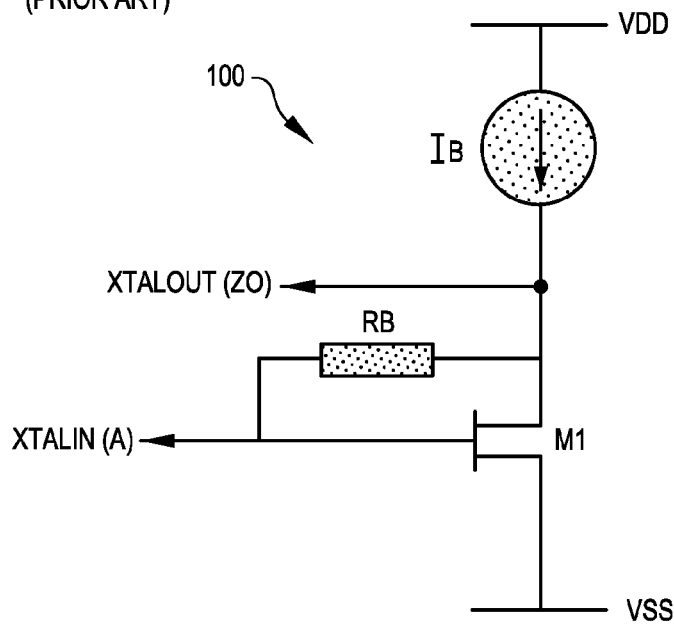
FIG. 1 is a schematic diagram of a conventional single-transistor 3-point oscillator core.
Figure 2:
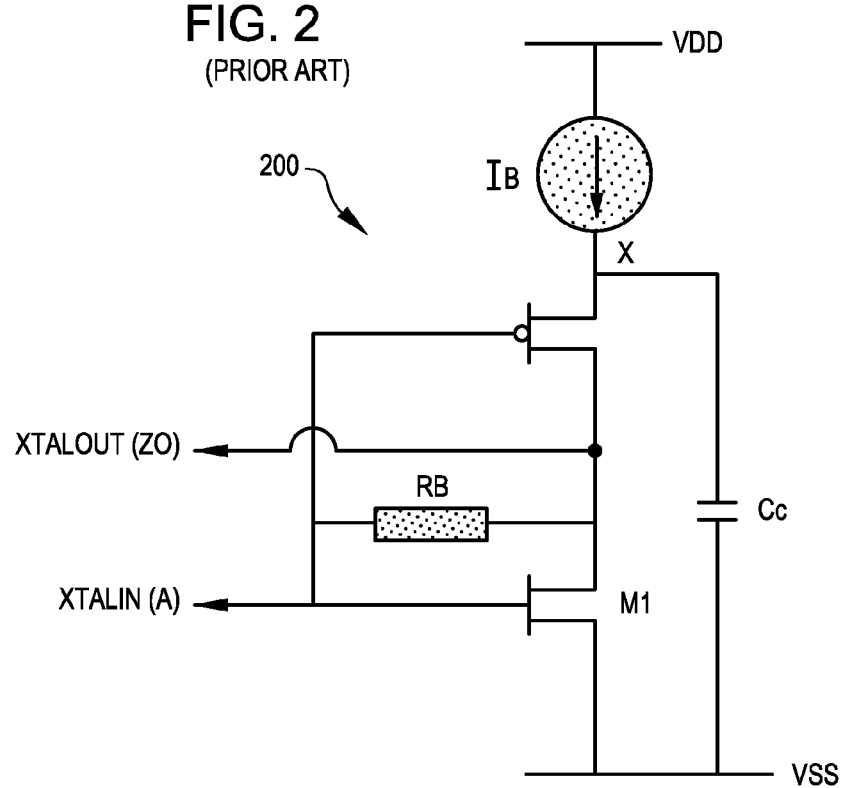
FIG. 2 is a schematic diagram of a conventional inverter-type oscillator core.

In accordance with an embodiment, there is provided a crystal oscillator circuit comprising a three-point oscillator core having crystal nodes; and a current feedback circuit coupled between the crystal nodes of the three-point oscillator core, the current feedback circuit having a gain factor that is configured such that in operation at least one of a leakage current at the crystal nodes is compensated, and a transconductance of the crystal oscillator circuit is enhanced.

The three-point oscillator core may include a first transistor device; and the current feedback circuit may include a second transistor device; and wherein the first transistor device and the second transistor device may define a current mirror.

The current mirror may have a mirror ratio of 1:α, with a α≈1.

The current feedback circuit may further comprise an inverting current amplifier circuit providing the gain factor.

The inverting current amplifier may be designed to sink/source a current of N/(N+1) times the leakage current, where N is the gain factor.

The crystal oscillator circuit may further comprise a bias-current-generator circuit coupled to the three-point oscillator core and the current-feedback circuit.

The leakage current may be compensated 1/(N+1) times, where N is the gain factor.

The current-feedback circuit may enhance a transconductance of the crystal oscillator circuit based on the gain factor.

A desired negative resistance may be achievable with the transconductance of the first transistor device of the three-point oscillator core (1+N)–times less compared to a conventional Pierce oscillator, where N is the gain factor.

A desired negative resistance may be achievable with the device bias current of the first transistor device of the three-point oscillator core (1+N)–times less compared to a conventional Pierce oscillator, where N is the gain factor.

The transconductance may be enhanced (N+1) times, where N is the gain factor.

A total power consumption of the crystal oscillator circuit may be reduced compared to a conventional Pierce oscillator for the same crystal parameters and leakage values.

The gain factor N may be approximately 9.

In accordance with an embodiment, there is provided a method of operating a crystal oscillator circuit, the method comprising of providing a current-feedback circuit coupled between crystal nodes of a three-point oscillator core of the crystal oscillator circuit, and configuring a gain factor of the current-feedback circuit such that at least one of a leakage current at the crystal nodes is compensated, and a transconductance of the crystal oscillator circuit is enhanced.

An embodiment, which is described below, provides a transconductance-enhanced (gm-boosted) and leakagecurrent compensated oscillator core enabling an ultra-low power crystal-oscillator design. By means of the gm-boosting technique, lower bias-current values may be used to provide the same operating transconductance and negative resistance as compared to a conventional single-transistor Collpitts or Pierce oscillator. Such an ultra-low-power crystal oscillator may be used in, e.g., battery-powered devices where long battery life may be a key requirement.

Figure 3:
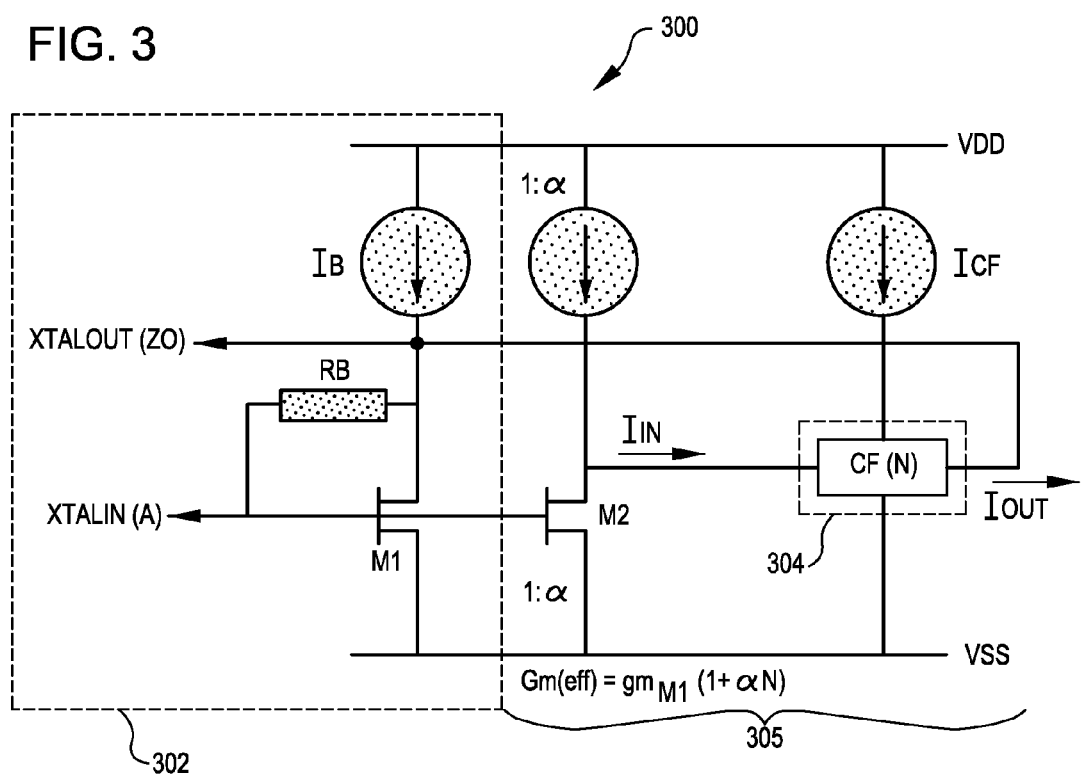
FIG. 3 is a schematic diagram of an oscillator circuit topology according to an embodiment.
Figure 4:
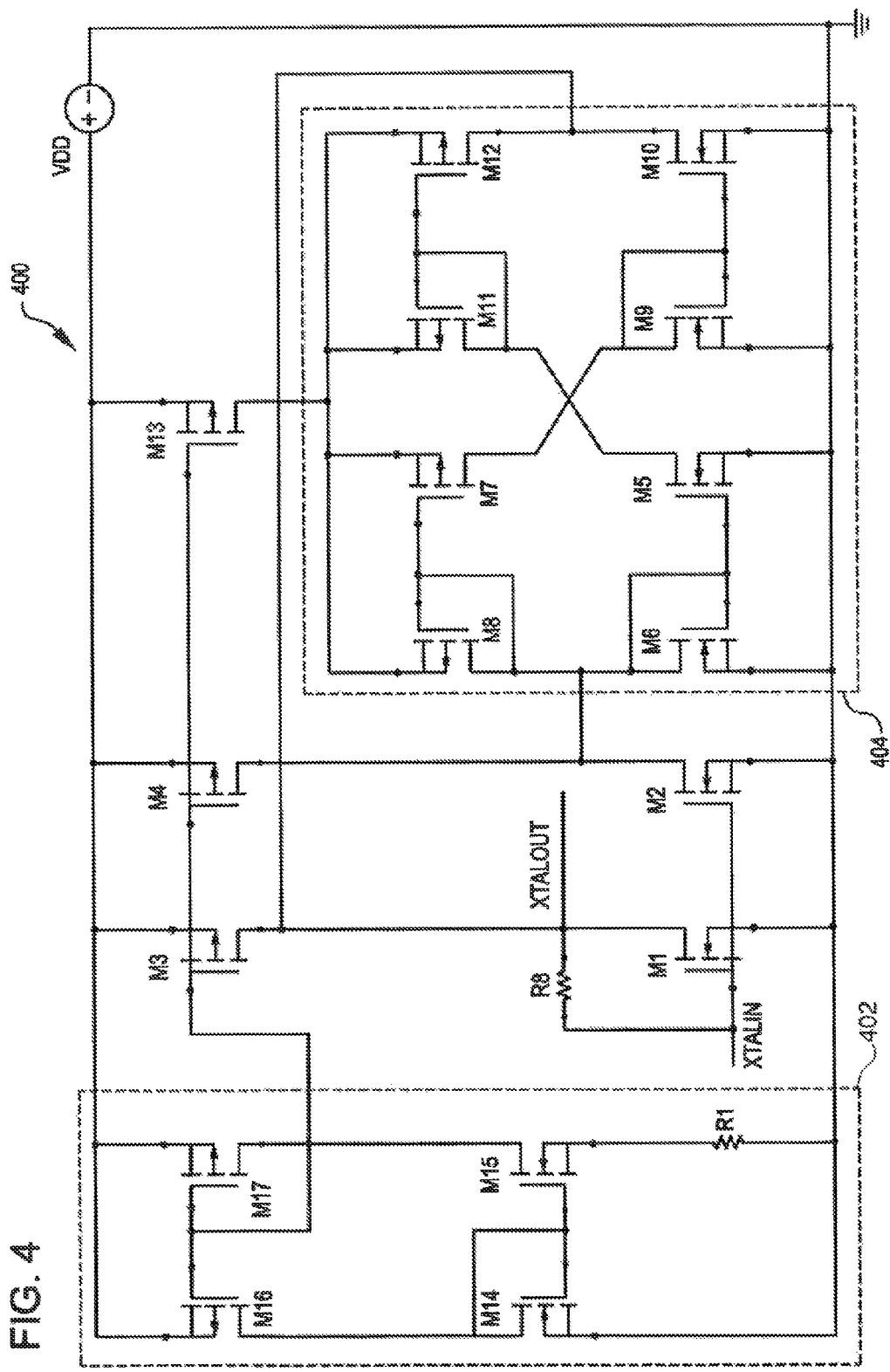
FIG. 4 is a schematic diagram of a corresponding CMOS implementation of the circuit topology of FIG. 3, according to an embodiment.

The circuit topology 300 of an embodiment is shown in FIG. 3, and a corresponding CMOS implementation 400 of the topology 300 is shown in FIG. 4.

Referring to FIG. 3, the crystal (not shown in FIG. 3) is coupled between the XTALIN and XTALOUT nodes, and load capacitances C1 and C2 (also not shown in FIG. 3) are coupled between XTALIN and ground and XTALOUT and ground, respectively. A Pierce Oscillator core 302 is indicated within dotted lines, with transistor pair M1–M2 acting as a current mirror (in this embodiment with the mirror ratio α=1). It is noted that in other embodiments, M1 and M2 may each be in the form of multiple-transistor devices. A current-mode active building block, here a current-flipper 304, is provided. A characterizing equation for an ideal inverting current-amplifier (herein referred to as the current flipper 304) is:

$$I_{out} = -NI_{in} \quad (3)$$

where N is the current-gain factor from input to output of the and the directions of the currents are in accordance with the network convention that all currents are flowing into the nodes. In an embodiment, the current flipper 304 and the current mirror form part of a current feedback circuit 305 of the circuit topology 300. Note that the current transfer function in equation (3) indicates the DC gain, but the gain for the actual circuit will be bandwidth limited (due to parasitic capacitances of the MOS device). But the 3 dB pole-frequency of the current-flipper 304 may be made significantly greater than (e.g., ten or more times greater than) the operating frequency $f_{op}$ (i.e., in this case significantly greater than 32 kHz).

Due to the current-feedback action in an embodiment, leakage currents arising at the XTALIN (A) and/or XTALOUT (ZO) nodes (due to the presence of, e.g., ESD-protection structures, not shown, present at both nodes) may be reduced by a factor of (1+N). For a conventional Pierce oscillator, a leakage current of $I_L$ arising at the A or ZO nodes changes the device current (through the transistor M1) to $I_B \pm I_L$ (note that both increase and decrease of the bias current is possible). Reduction of the device current due to leakage mandates the addition of a pessimistic leakage floor onto the device current during design, so that even in the worst case the device current is sufficient to provide the required operating transconductance. In an embodiment, the modified device current (drain current of M1) due to the leakage current at either the A or ZO nodes is sensed by means of the current mirror M1–M2, and the difference current (the difference between $I_B$ and the leakage current $I_L$) acts as the input to the current flipper 304. The current-feedback action thus makes the device current through M1 approximately equal to $I_B \pm I_L/(1+N)$, which is closer to $I_B$ than $I_B \pm I_L$ for the circuit without feedback. This can be derived from the following equation for $I_{M1}$ DC:

$$I_{M1} = \pm I_L + I_B - N \cdot \alpha \cdot (I_{M1} - I_B) \quad (4)$$

where α=1 and the bias current for M1 is approximately the same as the bias current for M2.

The small-signal analysis of an embodiment of the circuit 400 of FIG. 4 may be performed similarly to any other three-point oscillator analysis. This involves finding the small-signal impedance of the active circuit that the crystal "sees." Considering the small-signal model of the circuit 400 as shown in FIG. 4, routine circuit analysis yields the following equation for the small-signal impedance:

$$Z_{in}(\omega) = \frac{-(1+N)gm}{\omega^2 C_1 C_2} + \frac{-j(C_1 + C_2)}{\omega C_1 C_2} \quad (5)$$

which represents a series combination of a frequency-dependent negative resistance (FDNR) and an effective load capacitance. The numerator of the FDNR indicates that the device transconductance (gm of M1) is multiplied by the factor (1+N) and the effective transconductance of this modified oscillator core is $(1+N)gm_{M1}$. Thus, the operating transconductance $gm_{op}$ (to make the negative resistance e.g., three times that of the crystal series resistance) may be achieved by making the device transconductance of M1 (1+N)–times less compared to a conventional Pierce oscillator (since (1+N) $gm_{M1} = gm_{op}$).

Figure 5A:
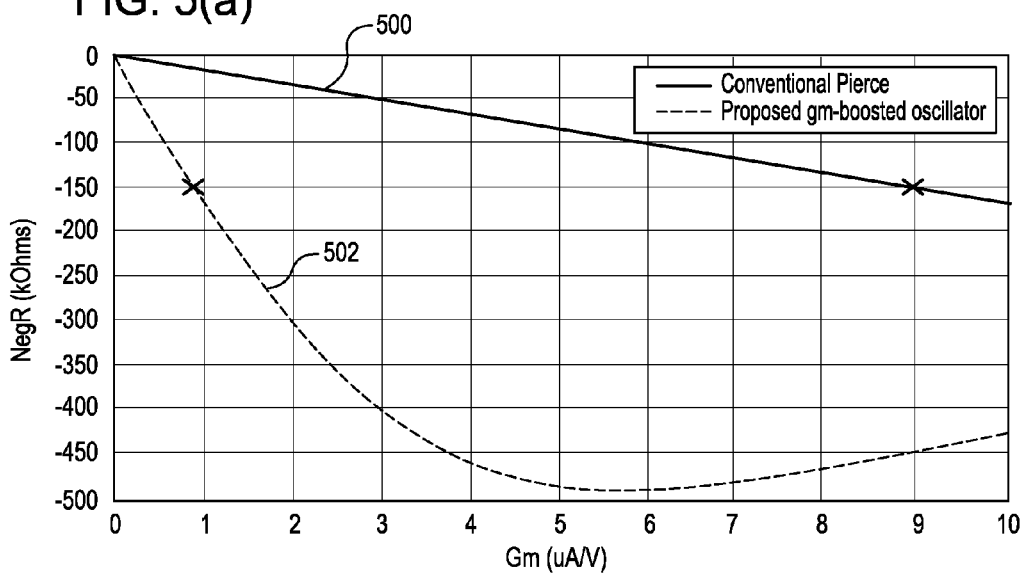
FIGS. 5 (a) and (b) are different-resolution plots of Re(Z) versus the transconductance of the transistor device for a conventional pierce oscillator and for an embodiment of an oscillator such as described in conjunction with FIGS. 3 and 4.

For the same over-drive voltage of device M1 as that of a conventional Pierce oscillator, this translates to a reduction in bias current of M1 by a factor of (1+N). Considering the shunt capacitance of the crystal (Co) in parallel with $Z_{in}$, the impedance that the crystal R-L-C series arm sees is a parallel combination of $Z_{in}$ and Co, i.e., $Z=Z_{in}||(1/sCo)$. The plot 500 of Re(Z) of a conventional Pierce oscillator (i.e., N=0) and the plot 502 of an embodiment of the circuits 300 and 400 of FIGS. 3 and 4 using N=9 versus the transconductance of device M1 ($gm_{M1}$) is shown in FIG. 5(a) and (b). It is evident from FIG. 5(a) that to achieve a desired negative resistance of 150 kΩ (magnitude), the transconductance of M1 required for an embodiment of the circuit 300/400 is 0.9 μA/V as compared to 9 μA/V (which is (1+N) times higher) for a conventional Pierce oscillator.

Figure 5B:
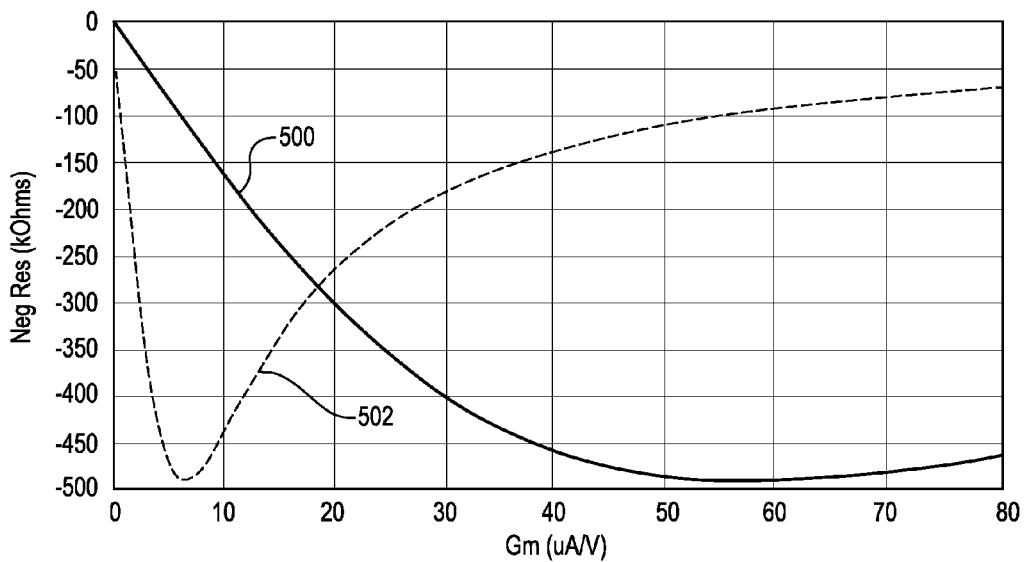

Furthermore, for a minimum negative resistance of 175 kΩ (magnitude), the transconductance of M1 an embodiment with N=9 is about 1.05 μA/V as compared to 10.5 μA/V for a conventional Pierce oscillator. The increase in the magnitude of the negative resistance with increase in transconductance occurs up to a particular value of gm, termed as the "optimum transconductance" ($gm_{optm}$). Beyond this value, negative resistance falls with increase in transconductance, as shown in FIG. 5(b). As with a conventional Pierce oscillator, the effective operating transconductance of the oscillator core in an embodiment, i.e., $(1+N)gm_{M1}$, is chosen to be greater than approximately $3 \cdot gm_{crit}$ but less than approximately $gm_{optm}$. It is also noted from FIGS. 5(a) and (b) that the maximum negative resistance (approximately −490 kΩ) occurs in an embodiment with N=9 at a transconductance of M1, $gm_{M1}$, of about 5.7 μA/V, as compared to the 57 μA/V for a conventional Pierce oscillator without current feedback.

In order to illustrate the current saving that may accrue from an embodiment, a comparison is made to some typical numbers from an existing 32 kHZ crystal oscillator in HCMOS9A technology, taking the standard 32 kHz crystal (most widely used) model parameters, namely, $R_m$=50 kΩ, $C_o$=4 pF. With a load capacitance of $C_1=C_2$=30 pF, to achieve a magnitude of negative resistance of more than 175 kΩ requires about 600 nA (minimum) of biasing current $I_B$ (for the device to be working in the saturation region with over-drive voltage of about 30 mV)—this corresponds to an effective operating transconductance requirement of about 10.5 μA/V. If a leakage floor estimate of ±50 nA is assumed at both the crystal nodes A and ZO, an additional 100 nA is added to the device current, making it 700 nA. This is the minimum current required (at slowest process corner and temperature of −40° C.) to still achieve the required transconductance in the worst case. Since the bias-current generator 402 of FIG. 4 (for example a sub-threshold proportional-to-absolute-temperature (PTAT) current generator) has a process temperature spread of approximately 1:2, the bias current of 700 nA becomes 1.4 μA (for the fastest corner and temperature of 125° C.). This increase in current improves the operating transconductance and thereby also the negative resistance and oscillator start-up margin.

Considering the same aforementioned crystal parameters and leakage values of ±50 nA for a current-flipper gain of nine (i.e., N=9), in an embodiment the bias current $I_B$ for the M1 device may be reduced to approximately 70 nA. The current-flipper 404 is biased with a current $I_{CF}$ of approximately 180 nA, a value sufficient to compensate for compensating ±50 nA, at both the crystal nodes A and ZO. It is noted that the current-flipper 304,404 may be designed to appropriately sink/source a current of $I_L \cdot N/(1+N)$, where $I_L$ is the leakage current arising at either of the crystal nodes A and ZO. Thus, the minimum current consumption for an embodiment becomes 70·2 nA (bias currents for M1 and M2)+180 nA≈320 nA, as opposed to an approximately 700 nA current requirement for a conventional Pierce oscillator. This corresponds to a 55% current reduction.

It is noted that an embodiment is not limited to processes having higher leakage, but may also be suited for negligibly lower-leakage processes. In such a case, the functionality of the circuit in an embodiment relates to gm-boosting only. Without any leakage considerations, an embodiment of the oscillator 300, 400 requires a bias current of 60·2 nA (bias current for M1 and M2)+180 nA (same bias current for the current-flipper as discussed above). This corresponds to a current consumption of about 300 nA, as opposed to 600 nA minimum current requirement for a conventional Pierce oscillator.

Still referring to FIG. 3, for the feedback circuit 305 to compensate for only leakage current $I_L$ into the drain node of the transistor M1, the coupling between the amplifier 302 and the feedback circuit 305 (e.g., the coupling between M1 and M2) may be designed to pass only lower-frequencies.

Conversely, for the feedback circuit 305 to compensate for only the gm of the amplifier 302, the coupling between the amplifier 302 and the feedback circuit 305 (e.g., the coupling between M1 and M2) may be designed to pass only higher-frequencies.

Furthermore, although described as being the same, the bias current $I_B$ to M1 and the bias current to M2 may be different.

Referring to FIG. 4, an embodiment of the oscillator circuit 400 may also include a start-up circuit to force the oscillator circuit to a stable operating point at which it oscillates at a desired non-zero frequency; this prevents the circuit from operating at a stable operating point at which the circuit effectively oscillates at a zero frequency or at another undesirable frequency.

Moreover, although described as being coupled to a crystal, the circuits 300 and 400 may be coupled to a microelectromechanical (MEMS) oscillating element.

Figure 6:
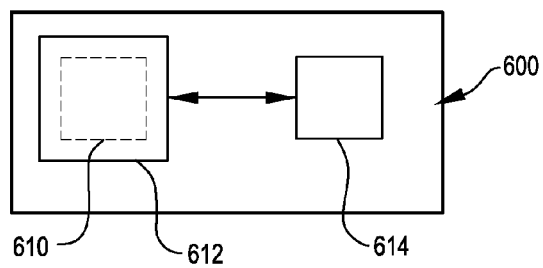
FIG. 6 is a block diagram of a system that incorporates an embodiment of a crystal oscillator circuit such as described in conjunction with FIGS. 3-5(b).

FIG. 6 is a block diagram illustrating a system 600, which incorporates a crystal oscillator circuit 610 according to an embodiment, for example an embodiment of the circuit 300 or the circuit 400 of FIGS. 3 and 4. Such a system 600 may be, for example, a wristwatch, clock, radio, computer, cell phone, smart phone, test and measurement equipment such as a counter, signal generator, oscilloscope, a control board for a battery-powered biomedical device, or a real-time-clock (RTC) chip set. Here, the crystal oscillator circuit 610 may be part of a first integrated circuit 612, which may be coupled to a second integrated circuit 614, where the first and second integrated circuits may be disposed on a same die or on different dies. Examples of the first and second integrated circuits 612 and 614 include a controller such as a processor, a power source, memory devices, etc. (not shown). In an embodiment, the crystal oscillator circuit 610 may be used to provide a stable clock signal for one or both of the circuits 612 and 614, or may be used to generate stable frequencies for a communication system 600 such as a smart phone.

It will be appreciated that an embodiment is not limited to the inverting current amplifier being a current flipper as described above, but other current-feedback circuit implementations may be used. Furthermore, a current mirror in an embodiment may employ other values for the mirror parameter α. Also, an embodiment is not limited to N=9 as described above. In addition, an embodiment of a crystal oscillator circuit may be employed with a multi-transistor crystal-oscillator cores.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An oscillator circuit, comprising:
a transconductance amplifier having a first gain configured to receive an input voltage on an input node, and configured to provide an output current having a first magnitude to an output node; and
a feedback circuit configured to provide to the output node a feedback current that is related to the output current by a second gain that is different than the first gain, the feedback current having a second magnitude that is different than the first magnitude.

2. The oscillator circuit of claim 1 wherein the transconductance amplifier includes a transistor having a control node coupled to the input node and having a path node coupled to the output node.

3. The oscillator circuit of claim 1 wherein:
the transconductance amplifier is configured to provide the output current having a direction relative to the output node; and
the feedback circuit is configured to provide the feedback current having the direction relative to the output node.

4. The oscillator circuit of claim 1 wherein:
the transconductance amplifier is configured to provide the output current having a phase; and
the feedback circuit is configured to provide the feedback current having approximately the phase.

5. The oscillator circuit of claim 1 wherein the feedback circuit is configured to provide the feedback current being related to the output current by the second gain that is greater than unity.

6. The oscillator circuit of claim 1, further comprising:
a bias circuit configured to provide a bias current to the feedback circuit; and
wherein the feedback circuit is configured to provide the feedback current being related to the output current by providing the feedback current being approximately equal to a product of the second gain and a difference between the output current and the bias current.

7. The oscillator circuit of claim 1 wherein the feedback circuit is configured to provide the feedback current being related to the output current by providing the feedback current being approximately equal to a product of the second gain and a change in the output current.

8. The oscillator circuit of claim 1 wherein the feedback circuit is configured to provide the feedback current being related to the output current by providing the feedback current being approximately equal to a product of the second gain and a small-signal component of the output current.

9. The oscillator circuit of claim 1 wherein the feedback circuit is configured to provide the feedback current being related to the output current by providing the feedback current being approximately equal to a product of the second gain and a higher-frequency component of the output current.

10. The oscillator circuit of claim 1 wherein:
the amplifier circuit is configured to generate a component of the output current in response to the input voltage; and
the feedback circuit is configured to provide the feedback current being related to the output current by providing a component of the feedback current being approximately equal to a product of the second gain and the component of the output current.

11. The oscillator circuit of claim 1 wherein:
the output node is configured to receive a leakage current; and
the feedback circuit is configured to provide the feedback current being related to the output current by providing a component of the feedback current being approximately equal to a product of the second gain and the leakage current.

12. The oscillator circuit of claim 1 wherein:
the output node is configured to receive a leakage current; and
the feedback circuit is configured to generate the feedback current to reduce a component of the output current that is related to the leakage current.

13. The oscillator circuit of claim 1 wherein the feedback circuit is configured to generate the feedback current to effectively increase the gain of the transconductance amplifier.

14. The oscillator circuit of claim 1 wherein:
the transconductance amplifier includes an amplifier transistor having a control node coupled to the input node and having a path node coupled to the output node; and
the feedback circuit includes
a feedback transistor having a control node coupled to the input node and having a path node, and
a current amplifier having an input node coupled to the path node of the feedback transistor and having an output node coupled to the output node of the transconductance amplifier.

15. The oscillator circuit of claim 1 wherein:
the transconductance amplifier includes an amplifier transistor having a conduction channel of a first width, a control node coupled to the input node, and a path node coupled to the output node; and
the feedback circuit includes
a feedback transistor having a conduction channel having a second width that is different than the first width, a control node coupled to the input node, and a path node, and a current amplifier having an input node coupled to the path node of the feedback transistor and having an output node coupled to the output node of the transconductance amplifier.

16. The oscillator circuit of claim 1 wherein:
the transconductance amplifier includes an amplifier transistor having a conduction channel of a first width, a control node coupled to the input node, and a path node coupled to the output node; and
the feedback circuit includes
a feedback transistor having a conduction channel having a second width that is greater than the first width, a control node coupled to the input node, and a path node, and
a current amplifier having a gain greater than unity, an input node coupled to the path node of the feedback transistor, and an output node coupled to the output node of the transconductance amplifier.

17. An oscillator, comprising:
an oscillator circuit, including
a transconductance amplifier having an input node and a first pain and configured to provide an output current to an output node, and
a feedback circuit configured to provide to the output node a feedback current that is related to the output current by a scaling factor associated with a second gain that is different from the first gain; and
a tank circuit coupled across the input and output nodes of the amplifier.

18. The oscillator of claim 17 wherein the tank circuit comprises a crystal.

19. The oscillator of claim 17 wherein the tank circuit comprises a MEMS oscillator element.

20. The oscillator of claim 17 wherein the tank circuit comprises a piezoelectric crystal.

21. The oscillator of claim 17, further comprising a capacitance coupled across the input and output nodes of the transconductance amplifier.

22. The oscillator of claim 17, further comprising:
a reference node;
a first capacitor coupled between the transconductance amplifier input node and the reference node; and
a second capacitor coupled between the transconductance amplifier output node and the reference node.

23. A system, comprising:
a first integrated circuit, including
an oscillator circuit, including
a transconductance amplifier having an input node and a first pain and configured to provide an output current to an output node, and
a feedback circuit configured to provide to the output node a feedback current that is proportional to the output current, wherein the proportionality corresponds to a second gain different than the first pain;
a tank circuit coupled across the input and output nodes of the transconductance amplifier; and
a second integrated circuit coupled to the first integrated circuit.

24. The system of claim 23 wherein the first integrated circuit, tank circuit, and second integrated circuit are disposed on a same die.

25. The system of claim 23 wherein the first integrated circuit, tank circuit, and second integrated circuit are disposed on two or more dies.

26. The system of claim 23 wherein the tank circuit is external to the first integrated circuit.

27. The system of claim 23 wherein one of the first and second integrated circuits comprises a controller.

28. A method, comprising:
generating an amplifier current at a node with a transconductance amplifier having a first gain factor, the current having a component; and
generating at the node a feedback current that is proportional to the component of the amplifier current, the proportionality corresponding to a second gain factor different than the first gain factor.

29. The method of claim 28 wherein the component of the amplifier current is caused by a leakage current at the node.

30. The method of claim 28, further comprising:
receiving a voltage with the transconductance amplifier; and
wherein generating the amplifier current includes generating the component of the amplifier current in response to the voltage.

31. The method of claim 28, further comprising:
receiving with the transconductance amplifier a voltage generated by a tank circuit; and
wherein generating the amplifier current include generating the component of the amplifier current in response to the voltage.

32. The method of claim 28 wherein generating the feedback current comprises:
multiplying the amplifier current by the first gain factor to generate an intermediate current;
generating a difference current equal to a different between the intermediate current and a bias current; and
generating the feedback current equal to a product of the difference current and the second gain factor.

33. The method of claim 28, further comprising:
generating a first bias current at the node; and
wherein generating the feedback current includes
multiplying the amplifier current by the first gain factor to generate an intermediate current;
generating a difference current equal to a difference between the intermediate current and a second bias current; and
generating the feedback current equal to a product of the difference current and the second gain factor.

34. The method of claim 28, further comprising:
generating a bias current at the node; and
wherein generating the feedback current includes
multiplying the amplifier current by the first gain factor to generate an intermediate current;
generating a difference current equal to a difference between the intermediate current and approximately the first bias current; and
generating the feedback current equal to a product of the difference current and the second gain factor.

35. A method, comprising:
receiving a leakage current at a node;
generating an amplifier current at the node with a transconductance amplifier having a first gain, the current having a component related to the leakage current; and
generating at the node a feedback current that causes the component of the transconductance amplifier current to be smaller than the leakage current by a factor according to a second gain different from the first gain.

36. A method, comprising:
generating an amplifier current at a node with a transconductance amplifier having a first gain, the current having a component approximately equal to a product of the gain and a component of an input voltage received by the transconductance amplifier; and generating at the node a feedback current approximately equal to a product of the current component and a second gain that is different from the first gain.

37. The method of claim 36 wherein the second gain is greater than the first gain.

* * * * *

UNITED STATES PATENT AND TRADEMARK OFFICE
CERTIFICATE OF CORRECTION

PATENT NO. : 8,653,898 B2  
APPLICATION NO. : 13/173420  
DATED : February 18, 2014  
INVENTOR(S) : Abhirup Lahiri and Anurag Tiwari Page 1 of 1

It is certified that error appears in the above-identified patent and that said Letters Patent is hereby corrected as shown below:

In the Claims:

Column 9, line 21, the phrase "first pain and configured to provide an output current" should read --first gain and configured to provide an output current--

Column 9, line 48, the phrase "first pain and configured to provide an output current" should read --first gain and configured to provide an output current--

Column 9, line 53, the phrase "a second gain different than the first pain;" should read --a second gain different than the first gain;--

Signed and Sealed this  
Ninth Day of September, 2014

Michelle K. Lee  
*Deputy Director of the United States Patent and Trademark Office*